United States Patent
Inoue et al.

(10) Patent No.: US 6,753,717 B2
(45) Date of Patent: Jun. 22, 2004

(54) H-BRIDGE DRIVER

(75) Inventors: Koichi Inoue, Kyoto (JP); Takao Osuka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/793,394

(22) Filed: Feb. 27, 2001

(65) Prior Publication Data

US 2002/0005748 A1 Jan. 17, 2002

(30) Foreign Application Priority Data

Feb. 29, 2000 (JP) ........................................ 2000-057985

(51) Int. Cl.[7] .............................................. H03K 17/56
(52) U.S. Cl. ...................... 327/423; 327/424; 327/494; 327/587; 327/588
(58) Field of Search ................................ 327/423, 425, 327/424, 587, 588, 495, 165, 166, 170–172, 379, 381, 384, 427, 433, 494

(56) References Cited

U.S. PATENT DOCUMENTS

| | | | | | |
|---|---|---|---|---|---|
| 4,535,203 A | * | 8/1985 | Jenkins | ........................ | 379/333 |
| 4,805,214 A | * | 2/1989 | Fensch et al. | ............... | 379/399 |
| 4,950,919 A | * | 8/1990 | Rossi et al. | ................... | 327/401 |
| 5,057,720 A | * | 10/1991 | Hattori | ........................ | 327/424 |
| 5,132,563 A | * | 7/1992 | Fujii et al. | ..................... | 326/27 |
| 5,243,472 A | * | 9/1993 | Molstad | ........................ | 360/66 |
| 5,257,175 A | * | 10/1993 | Skelton et al. | ................. | 363/56 |
| 5,530,639 A | * | 6/1996 | Schulz et al. | .................. | 363/17 |
| 5,631,527 A | * | 5/1997 | Canclini | ...................... | 318/254 |
| 5,896,057 A | * | 4/1999 | Chicca et al. | ................ | 327/423 |
| 6,034,537 A | * | 3/2000 | Burrows et al. | ............... | 326/33 |
| 6,052,017 A | * | 4/2000 | Pidutti et al. | ................ | 327/424 |
| 6,124,751 A | * | 9/2000 | Pidutti | ......................... | 327/424 |
| 6,147,545 A | * | 11/2000 | Marshall | ....................... | 327/424 |
| 6,229,273 B1 | * | 5/2001 | Kelly et al. | .................. | 318/254 |
| 6,259,305 B1 | * | 7/2001 | Pakriswamy | ................. | 327/424 |
| 6,262,632 B1 | * | 7/2001 | Corsi et al. | .................. | 330/251 |
| 6,388,855 B1 | * | 5/2002 | Ikezu | .......................... | 361/100 |
| 6,617,913 B1 | * | 9/2003 | Johnson | ....................... | 327/423 |

FOREIGN PATENT DOCUMENTS

| | | | | |
|---|---|---|---|---|
| DE | 4403375 A1 | * | 9/1994 | |
| EP | 0587945 A1 | * | 9/1992 | |
| JP | 10126170 | * | 5/1998 | |
| JP | 2001244800 | * | 9/2003 | |
| SG | 0693749 A1 | * | 1/1996 | |

* cited by examiner

*Primary Examiner*—Timothy P. Callahan
*Assistant Examiner*—Hai L. Nguyen
(74) *Attorney, Agent, or Firm*—Arent Fox PLLC

(57) ABSTRACT

An H-bridge driver has a drive signal generating circuit for generating a square-wave signal as a drive signal. The H-bridge driver also has a waveform shaping circuit for blunting the waveform of the drive signal at the rising and trailing edges thereof. The waveform shaping circuit has a first circuit for generating, in a rising period of the square-wave signal fed thereto, a first current having a positive peak at the center of the rising period, a second circuit for generating, in a trailing period of the square-wave signal fed thereto, a second current having a negative peak at the center of the trailing period, and a capacitor to which the first and second currents are fed. The waveform shaping circuit outputs the voltage across the capacitor as its output voltage.

4 Claims, 4 Drawing Sheets

H-BRIDGE DRIVER

BACKGROUND OF THE INVENTION

1. Field of the Invention

The present invention relates to an H-bridge driver having a drive signal generating circuit for generating a square-wave signal as a drive signal for driving an H-bridge that is used to drive a load from both ends thereof in a complementary fashion.

2. Description of the Prior Art

FIG. 4 shows a conventional H-bridge driver for driving a load such as the primary coil of a transformer. This H-bridge driver includes, for example, an H-bridge 400 consisting of two complementary connection circuits 300-1 and 300-2, of which each is composed of a p-channel MOS FET (hereinafter referred to as the "pMOS") 301 and an n-channel MOS FET (hereinafter referred to as the "nMOS") 302. Within each of the complementary connection circuits 300-1 and 300-2, the source of the pMOS 301 is connected to a supply voltage $V_{CC}$, the source of the nMOS 302 is connected to ground GND, and the drains of the pMOS 301 and the nMOS 302 are connected together. In this circuit configuration, to drive the H-bridge 400, a signal P1 output from a logic circuit 100' is fed through a buffer amplifier 200-1' directly to the gates of the pMOS 301 and the nMOS 302 of the complementary connection circuit 300-1, and a signal P2 output from the logic circuit 100', which is an inverted version of the signal P1, is fed through a buffer amplifier 200-2' directly to the gates of the pMOS 301 and the nMOS 302 of the complementary connection circuit 300-2.

In this circuit configuration, let the threshold level at which the p-channel MOS FETs turn on be $V_{thp}$, and let the threshold level at which the n-channel MOS FETs turn on be $V_{thn}$. Moreover, assume that the high-level voltage of the pulse signals P1 and P2 is set to be higher than $V_{CC}-V_{thp}$ and the low-level voltage thereof is set to be lower than $V_{thn}$. Under these conditions, when the pulse signal P1 is at the low level and the pulse signal P2 is at the high level, in the complementary connection circuit 300-1, the pMOS 301 is on and the nMOS 302 is off, and, in the complementary connection circuit 300-2, the pMOS 301 is off and the nMOS 302 is on. As a result, a current flows from the supply voltage $V_{CC}$ to the pMOS 301 of the complementary connection circuit 300-1, then to a load 500, then to the nMOS 302 of the complementary connection circuit 300-2, and then to ground GND. By contrast, when the pulse signal P1 is at the high level and the pulse signal P2 is at the low level, in the complementary connection circuit 300-1, the pMOS 301 is off and the nMOS 302 is on, and, in the complementary connection circuit 300-2, the pMOS 301 is on and the nMOS 302 is off. As a result, a current flows from the supply voltage $V_{CC}$ to the pMOS 301 of the complementary connection circuit 300-2, then to the load 500, then to the nMOS 302 of the complementary connection circuit 300-1, and then to ground GND. In this way, the load 500 is driven from both ends thereof in a complementary fashion.

However, in this conventional H-bridge driver, since the H-bridge 400 is driven by directly using the square-wave pulse signals (i.e. signals containing high-frequency components) output from the logic circuit 100', the inductance component of the load 500 causes high-frequency noise of the order of tens of millivolts. For this reason, conventional H-bridge drivers are unusable in audio, visual, and similar applications.

SUMMARY OF THE INVENTION

An object of the present invention is to provide an H-bridge driver that has a drive signal generating circuit for generating a square-wave signal as a drive signal for driving an H-bridge and that permits significant reduction of the high-frequency noise caused by the inductance component of the load of the H-bridge.

To achieve the above object, according to the present invention, an H-bridge driver including a drive signal generating circuit for generating a square-wave signal as a drive signal for driving an H-bridge is provided with: a waveform shaping circuit for blunting the drive signal generated by the drive signal generating circuit to drive the H-bridge; and a control circuit for keeping the voltage on the output side of the H-bridge equal to the voltage output from the waveform shaping circuit. In this circuit configuration, a signal having a blunted version of the waveform of the drive signal for driving the H-bridge appears on the output side of the H-bridge.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
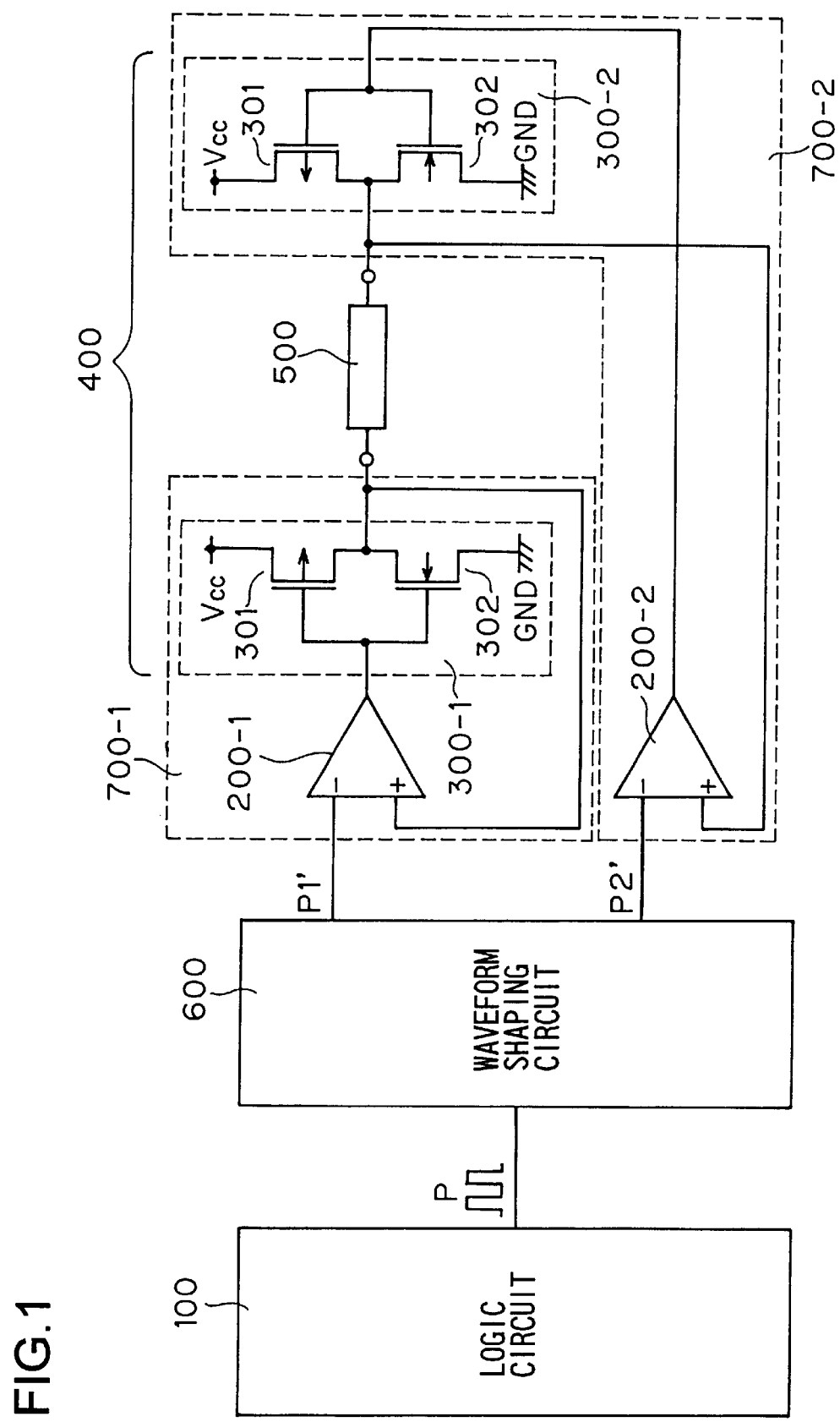
FIG. 1 is a diagram showing the circuit configuration of an H-bridge driver embodying the invention.

Hereinafter, an embodiment of the present invention will be described with reference to the drawings. FIG. 1 is a diagram showing the circuit configuration of an H-bridge driver embodying the invention. Reference numeral 100 represents a logic circuit for producing a square-wave pulse signal P as a drive signal for driving an H-bridge. Reference numerals 200-1 and 200-2 represent operational amplifiers. Reference numeral 600 represents a waveform shaping circuit for producing a signal P1' by blunting the waveform of the pulse signal output from the logic circuit 1 and a signal P2' by inverting the signal P1'. The logic circuit 100, the operational amplifiers 200-1 and 200-2, the waveform shaping circuit 600, and the conductors interconnecting these components are formed in a single semiconductor device.

Figure 2:
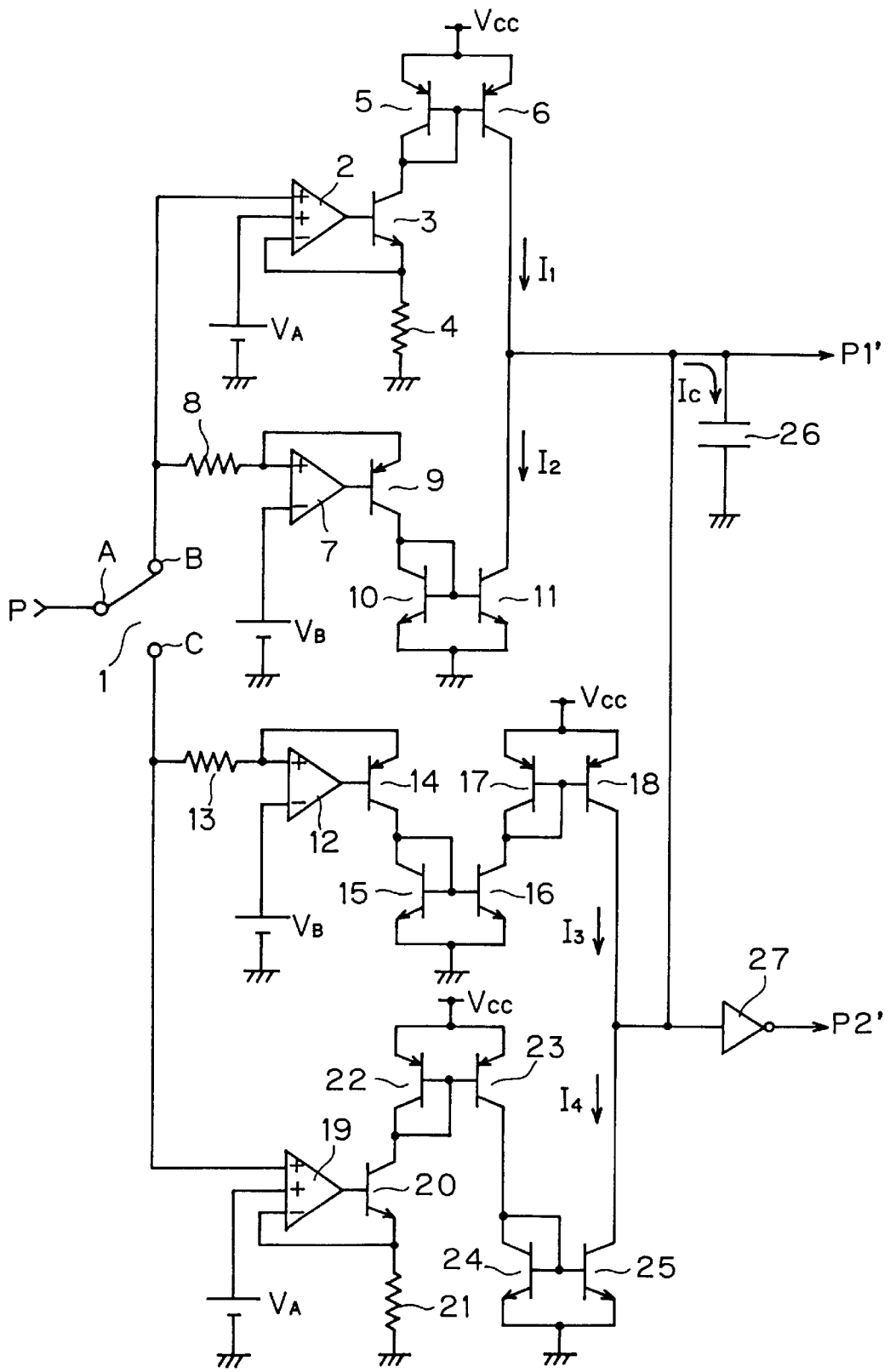
FIG. 2 is a diagram showing an example of the circuit configuration of the waveform shaping circuit.
Figure 3:
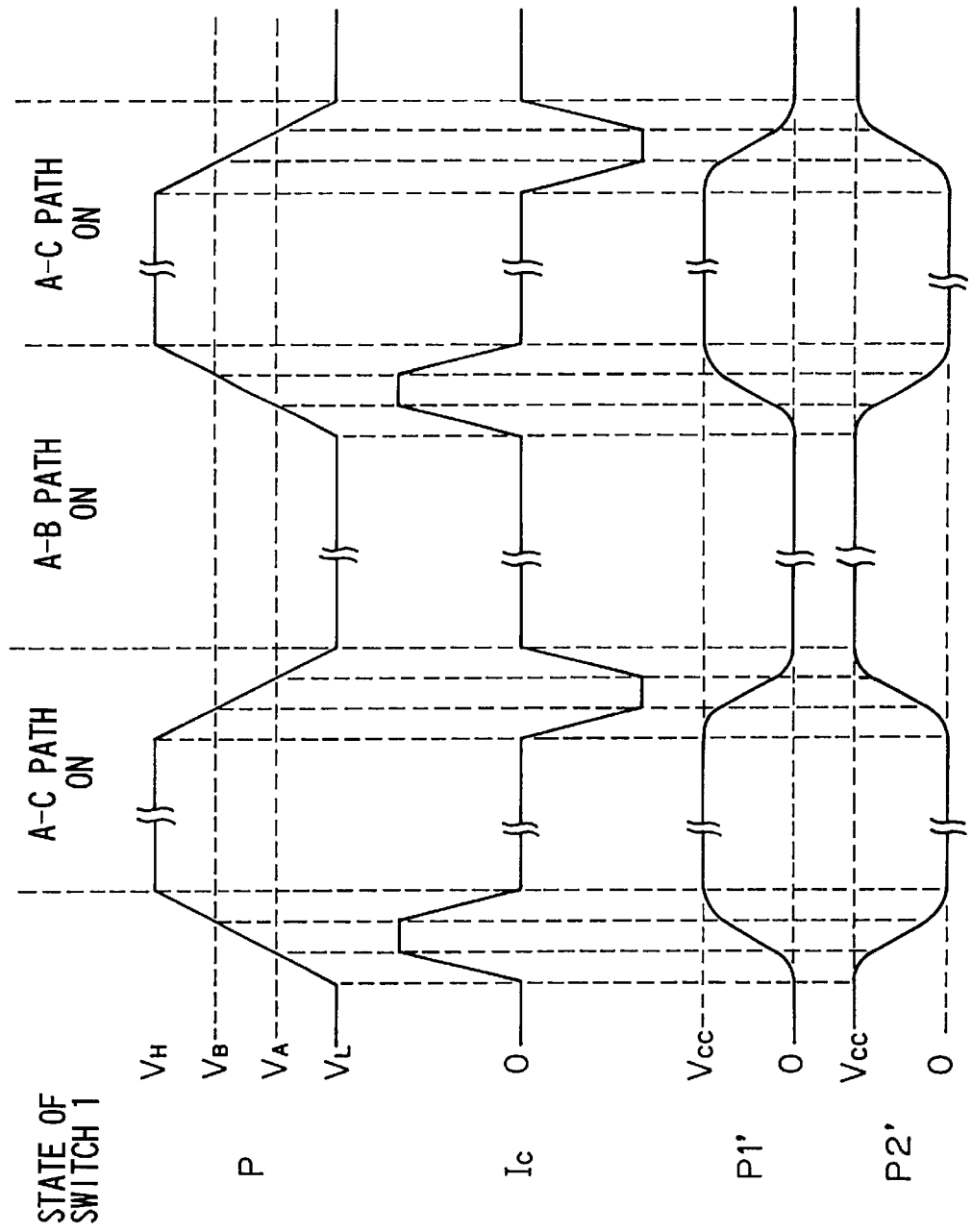
FIG. 3 is a waveform diagram of the signals observed at relevant points in the H-bridge driver shown in FIG. 1.
Figure 4:
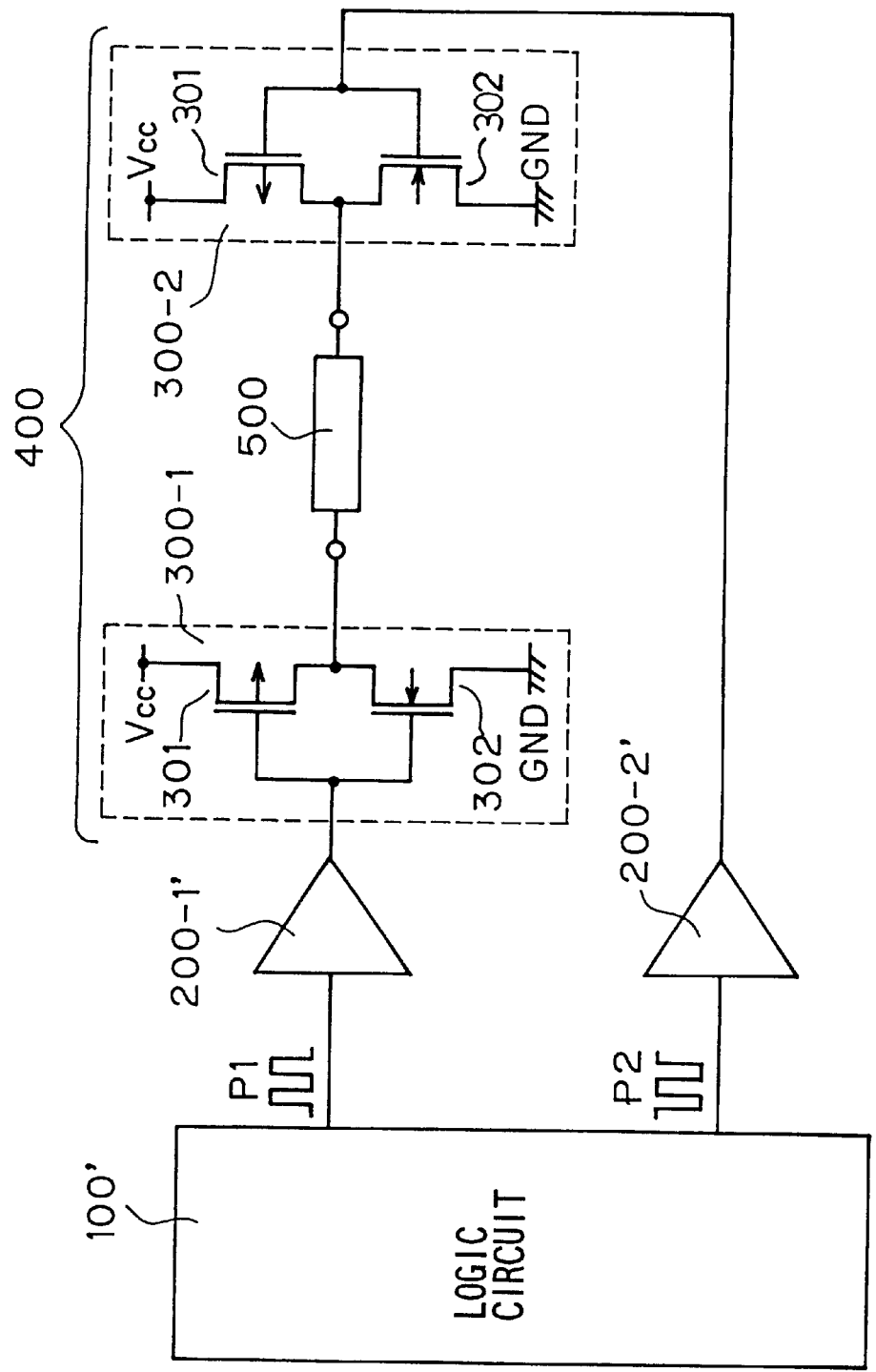
FIG. 4 is a diagram showing the circuit configuration of a conventional H-bridge driver.

FIG. 2 shows an example of the circuit configuration of the waveform shaping circuit 600. A switch 1 has three terminals A, B, and C, and turns on (i.e. closes) either the path between the terminals A and B or the path between the terminals A and C. Specifically, as shown in FIG. 3, by a non-illustrated circuit, the switch 1 is so controlled that, when the pulse signal P output from the logic circuit 100 turns to a high level $V_H$, the path between the terminals A and C is turned on and, when the pulse signal P turns to a low level $V_L$, the path between the terminals A and B is turned on. The pulse signal P output from the logic circuit 100 is fed to the terminal A of the switch 1.

An operational amplifier 2 has its first non-inverting input terminal connected to the terminal B of the switch 1, and receives at its second non-inverting input terminal a reference voltage VA. Here, when the voltage at the first non-inverting input terminal is lower than the voltage at the second non-inverting input terminal, the operational amplifier 2 amplifies and outputs the difference between the voltage at the first non-inverting input terminal and the voltage at the inverting input terminal and, when the voltage at the first non-inverting input terminal is equal to or higher than the voltage at the second non-inverting input terminal, the operational amplifier 2 amplifies and outputs the difference between the voltage at the second non-inverting input terminal and the voltage at the inverting input terminal.

An NPN-type transistor 3 has its base connected to the output terminal of the operational amplifier 2, has its emitter grounded through a resistor 4 and connected to the inverting input terminal of the operational amplifier 2, and has its collector connected to the collector of a PNP-type transistor 5. The transistor 5 is diode-connected, and has its base connected to the base of a PNP-type transistor 6. The transistors 5 and 6 together constitute a current mirror circuit. The transistors 5 and 6 receive at their emitters a supply voltage $V_{CC}$.

An operational amplifier 7 has its non-inverting input terminal connected through a resistor 8 to the terminal B of the switch 1, and receives at its inverting input terminal a reference voltage $V_B$. The reference voltages $V_A$ and $V_B$, and the high-level voltage $V_H$ and the low-level voltage $V_L$ of the pulse signal P output from the logic circuit 100, fulfill the following relations: $V_L=0$, $V_L<V_A<V_B<V_H$, and $V_A+V_B=V_H$.

A PNP-type transistor 9 has its base connected to the output terminal of the operational amplifier 7, has its emitter connected to the non-inverting input terminal of the operational amplifier 7, and has its collector connected to the collector of a PNP-type transistor 10. The transistor 10 is diode-connected, and has its base connected to the base of an NPN-type transistor 11. The transistors 10 and 11 together constitute a current mirror circuit. The transistors 10 and 11 have their emitters grounded.

An operational amplifier 12 has its non-inverting input terminal connected through a resistor 13 to the terminal C of the switch 1, and receives at its inverting input terminal the reference voltage $V_B$. A PNP-type transistor 14 has its base connected to the output terminal of the operational amplifier 12, has its emitter connected to the non-inverting input terminal of the operational amplifier 12, and has its collector connected to the collector of an NPN-type transistor 15.

The transistor 15 is diode-connected, and has its base connected to the base of an NPN-type transistor 16. The transistors 15 and 16 together constitute a current mirror circuit. The transistors 15 and 16 have their emitters grounded.

A PNP-type transistor 17 is diode-connected, and has its collector connected to the collector of the transistor 16. A PNP-type transistor 18 has its base connected to the base of the transistor 17. The transistors 17 and 18 together constitute a current mirror circuit. The transistors 17 and 18 receive at their emitters the supply voltage $V_{CC}$.

An operational amplifier 19 has its first non-inverting input terminal connected to the terminal C of the switch 1, and receives at its second non-inverting input terminal the reference voltage VA. Here, when the voltage at the first non-inverting input terminal is lower than the voltage at the second non-inverting input terminal, the operational amplifier 19 amplifies and outputs the difference between the voltage at the first non-inverting input terminal and the voltage at the inverting input terminal and, when the voltage at the first non-inverting input terminal is equal to or higher than the voltage at the second non-inverting input terminal, the operational amplifier 19 amplifies and outputs the difference between the voltage at the second non-inverting input terminal and the voltage at the inverting input terminal.

An NPN-type transistor 20 has its base connected to the output terminal of the operational amplifier 19, has its emitter grounded through a resistor 21 and connected to the inverting input terminal of the operational amplifier 19, and has its collector connected to the collector of a PNP-type transistor 22.

The transistor 22 is diode-connected, and has its base connected to the base of a PNP-type transistor 23. The transistors 22 and 23 together constitute a current mirror circuit. The transistors 22 and 23 receive at their emitters the supply voltage $V_{CC}$.

An NPN-type transistor 24 is diode-connected, and has its collector connected to the collector of the transistor 23. An NPN-type transistor 25 has its base connected to the base of the transistor 24. The transistors 24 and 25 together constitute a current mirror circuit. The transistors 24 and 25 have their emitters grounded.

The collectors of the transistors 6, 11, 18, and 25 are connected together to one end of a capacitor 26, of which the other end is grounded. An inverting circuit 27 inverts and then outputs the voltage signal appearing across the capacitor 26. Thus, the waveform shaping circuit 600 outputs the voltage signal P1' appearing across the capacitor 26 and the output signal P2' of the inverting circuit 27.

Configured as described above, the waveform shaping circuit 600 operates in the following manner. As shown in FIG. 3, when the voltage $P_V$ of the pulse signal P output from the logic circuit 100 rises from the low level $V_L$ to the high level $V_H$, if it is assumed that the resistance of each of the resistors 4, 8, 13, and 21 is equal to R, for the collector current $I_1$ of the transistor 6, the following relations hold: when $P_V<V_A$, $I_1=P_V/R$ and, when $V_A \leq P_V$, $I_1=V_A/R$; for the collector current $I_2$ of the transistor 11, the following relations hold: when $P_V \leq V_B$, $I_2=0$ and, when $V_B<P_V$, $I_2=(P_V-V_B)/R$; for the collector currents $I_3$ and $I_4$ of the transistors 18 and 25 respectively, the following relation holds: $I_3=I_4=0$. Hence, for the current $I_C$ that flows into the capacitor 26, when $P_V<V_A$, the relation $I_C=P_V/R$ holds, and thus, as $P_V$ rises, $I_C$ increases until, when $P_V=V_A$, the relation $I_C=V_A/R$ holds and thus $I_C$ becomes constant; when $P_V$ rises further such that $V_B<P_V$, the relation $I_C=V_A/R-(P_V-V_B)/R$ holds and thus, as $P_V$ rises, $I_C$ decreases until, when $P_V$ equals the high level $V_H$, the relation $I_C=0$ holds.

By contrast, when the voltage $P_V$ of the pulse signal P output from the logic circuit 100 falls from the high level $V_H$ to the low level $V_L$, for $I_1$, and $I_2$, the following relation holds: $I_1=I_2=0$; for $I_3$, the following relations hold: when $V_B<P_V$, $I_3=(P_V-V_B)/R$ and, when $P_V \leq V_B$, $I_3=0$; for $I_4$, the following relations hold: when $V_A \leq P_V$, $I_4=V_A/R$ and, when $P_V<V_A$, $I_4=P_V/R$. Hence, for the current $I_C$ that flows into the capacitor 26, when $V_B<P_V$, the relation $I_C=(P_V-V_B)/R-V_A/R$ holds, and thus, as $P_V$ falls, $I_C$ decreases until, when $P_V=V_B$, the relation $I_C=-V_A/R$ holds and thus $I_C$ becomes constant; when $P_V$ falls further such that $P_V<V_A$, the relation $I_C=-P_V/R$ holds and thus, as $P_V$ falls, $I_C$ increases until, when $P_V$ equals the low level $V_L$, the relation $I_C=0$ holds.

Thus, the voltage signal P1' appearing across the capacitor 26 is the integral of the current $I_C$ that flows into the capacitor 26, and therefore has a waveform as shown in FIG. 3, i.e. a blunted version of the waveform of the pulse signal P output from the logic circuit 100. In this way, the waveform shaping circuit 600 outputs the signal P1' obtained by blunting the waveform of the pulse signal P output from the logic circuit 100 and the signal P2' obtained by inverting the signal P1'.

The signals P1' and P2' output from the waveform shaping circuit 600 are fed to the inverting input terminals (−) of the operational amplifiers 200-1 and 200-2, respectively. The non-inverting input terminals (+) of the operational amplifiers 200-1 and 200-2 are connected to the output sides (the node at which the drains of the pMOS 301 and the nMOS 302 are connected together) of the complementary connection circuits 300-1 and 300-2, respectively.

As a result, the operational amplifier 200-1, the complementary connection circuit 300-1, and the negative feedback control circuit 700-1 formed by the interconnection of those components operate in such a way as to keep the voltage on the output side of the complementary connection circuit 300-1 equal to the voltage of the signal P1' output from the waveform shaping circuit 600. Likewise, the operational amplifier 200-2, the complementary connection circuit 300-2, and the negative feedback control circuit 700-2 formed by the interconnection of those components operate in such a way as to keep the voltage on the output side of the complementary connection circuit 300-2 equal to the voltage of the signal P2' output from the waveform shaping circuit 600.

In short, on the output side of the complementary connection circuit 300-1 appears a signal P1' having a blunted version of the waveform of the pulse signal P output from the logic circuit 10 (i.e. a version of the pulse signal P from which high-frequency components have been removed), and on the output side of the complementary connection circuit 300-2 appears a signal P2' having a blunted and then inverted version of the waveform of the pulse signal P output from the logic circuit 10 (i.e. an inverted version of the pulse signal P from which high-frequency components have been removed). This greatly reduces the high-frequency noise caused by the inductance component of the load 500, and thereby makes the H-bridge driver of this embodiment usable in audio, visual, and similar applications.

In the embodiment described above, the waveform shaping circuit 600 (serving as a blunting circuit) is composed of a first circuit that generates, in a rising period of the pulse signal P from the logic circuit 100, a first current having a positive peak at the center of the rising period (in the embodiment shown in FIG. 2, the first circuit is composed of, if its components are named by their reference symbols, the elements 1 to 11, and $V_A$ and $V_B$), a second circuit that generates, in a trailing period of the pulse signal P, a second current having a negative peak at the center of the trailing period (in the embodiment shown in FIG. 2, the second circuit is composed of, if its components are named by their reference symbols, the elements 12 to 25, and $V_A$ and $V_B$), and a capacitor 26 to which the first and second currents are fed. The waveform shaping circuit 600 outputs as its output voltage the voltage across the capacitor 26.

The embodiment described above deals with a case in which the output of an operational amplifier is fed to the gates of both transistors constituting a complementary output circuit. However, it is preferable to adopt a circuit configuration in which an operational amplifier switches its output using two different threshold voltages or with different timing so that a pMOS and an nMOS are switched at different voltages. This helps reduce the through current in such output circuits.

As described above, in an H-bridge driver embodying the present invention, a signal having a blunted version of the waveform of the drive signal for driving an H-bridge appears on the output side of the H-bridge. Therefore, even in cases where a square-wave signal is generated as the drive signal for driving an H-bridge, it is possible to greatly reduce the high-frequency noise caused by the inductance component of the H-bridge. This makes H-bridge drivers embodying the present invention usable in audio, visual, and similar applications.

What is claimed is:

1. A H-bridge driver for feeding a first output to one end of a load and feeding a second output to another end of the load, comprising:

a first output circuit composed of a first p-channel MOS transistor having a source thereof connected to a direct-current supply voltage and a first n-channel MOS transistor having a source thereof connected to ground, the first output circuit deriving the first output from a node between a drain of the first p-channel MOS transistor and a drain of the first n-channel MOS transistor;

a second output circuit composed of a second p-channel MOS transistor having a source thereof connected to the direct-current supply voltage and a second n-channel MOS transistor having a source thereof connected to ground, the second output circuit deriving the second output from a node between a drain of the second p-channel MOS transistor and a drain of the second n-channel MOS transistor;

a waveform shaping circuit for producing from a square-wave signal fed thereto a first drive signal by blunting trailing edges of the square-wave signal and a second drive signal by inverting polarity of the first driving signal;

first means for feeding the first drive signal to a gate of the first p-channel MOS transistor and to a gate of the first n-channel MOS transistor; and second means for feeding the second drive signal to a gate of the second p-channel MOS transistor and to a gate of the second n-channel MOS transistor, wherein the waveform shaping circuit comprises a first circuit for generating, in a rising period of the square-wave signal fed thereto, a first current having a positive peak at a center of the rising period, a second circuit for generating, in a trailing period of the square-wave signal fed thereto, a second current having a negative peak at a center of the trailing period, and a capacitor to which the first and second currents are fed, the waveform shaping circuit outputting a voltage across the capacitor as an output voltage.

2. An H-bridge driver comprising:

an H-bridge driver including a drive signal generating circuit for generating a square-wave signal as a drive signal for driving an H-bridge comprising;

a waveform shaping circuit for blunting the drive signal generated by the drive signal generating circuit to drive the H-bridge; and a control circuit that receives a voltage output from the waveform shaping circuit and operates to keep a voltage on an output side of the H-bridge equal to the voltage output from the waveform shaping circuit, wherein the waveform shaping circuit comprises a first circuit for generating, in a rising period of the square-wave signal fed thereto, a first current having a positive peak at a center of the rising period, a second circuit for generating, in a trailing period of the square-wave signal fed thereto, a second current having a negative peak at a center of the trailing period, and a capacitor to which the first and second currents are fed, the waveform shaping circuit outputting a voltage across the capacitor as an output voltage.

3. An H-bridge driver including a drive signal generating circuit for generating a square-wave signal as a drive signal for driving an H-bridge, and comprising two pairs of a complementary connection circuit, the H-bridge driver further comprising:

a waveform shaping circuit for receiving and blunting the drive signal generated by the drive signal generating circuit to drive the H-bridge; and a control circuit that receives as an input signal a voltage output from the waveform shaping circuit, receives as another input signal a voltage output from the H-bridge, and feeds each pair of the complementary connection circuit with a common output signal so that the control circuit operates to keep a voltage on an output side of the H-bridge equal to and as blunted as the voltage output from the waveform shaping circuit.

4. An H-bridge driver comprising:

a drive signal generating circuit for generating a drive signal for driving an H-bridge;

a waveform shaping circuit comprising:

a first circuit for generating, in a rising period of the drive signal fed thereto, a first current and blunting rising edges of the drive signal by means of integrating the first current, and a second circuit for generating, in a trailing period of the drive signal fed thereto, second current and blunting trailing edges of the drive signal by means of integrating the second current, wherein the waveform shaping circuit outputs a first drive signal having a waveform blunted by the first and second circuits and a second drive signal having an inverted waveform of the first drive signal to drive the H-bridge, a first control circuit for receiving the first drive signal and a voltage fed back from one output side of the H-bridge so as to keep the voltage on one output side of the H-bridge equal to a voltage of the first drive signal; and a second control circuit for receiving the second drive signal and a voltage fed back from another output side of the H-bridge so as to keep the voltage on another output side of the H-bridge equal to a voltage of the second drive signal.

\* \* \* \* \*